(12) United States Patent
Shi et al.

(10) Patent No.: US 10,686,070 B2
(45) Date of Patent: Jun. 16, 2020

(54) TRENCH-GATE MOSFET AND METHOD FOR MANUFACTURING SAME

(71) Applicant: Shanghai Huahong Grace Semiconductor Manufacturing Corporation, Shanghai (CN)

(72) Inventors: Lei Shi, Shanghai (CN); Jinzheng Miao, Shanghai (CN); Rangxuan Fan, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 16/542,759

(22) Filed: Aug. 16, 2019

(65) Prior Publication Data

US 2020/0075763 A1    Mar. 5, 2020

(30) Foreign Application Priority Data

Aug. 28, 2018 (CN) .......................... 2018 1 0984537

(51) Int. Cl.
    *H01L 29/78*      (2006.01)
    *H01L 29/66*      (2006.01)
    *H01L 29/423*     (2006.01)

(52) U.S. Cl.
    CPC ...... *H01L 29/7827* (2013.01); *H01L 29/4236* (2013.01); *H01L 29/66666* (2013.01)

(58) Field of Classification Search
None
See application file for complete search history.

(56) References Cited

U.S. PATENT DOCUMENTS

| 2012/0146090 A1* | 6/2012 | Lui ..................... H01L 29/0834 257/139 |
| 2013/0330892 A1* | 12/2013 | Hsieh ................. H01L 29/66825 438/259 |
| 2014/0239388 A1* | 8/2014 | Lee ..................... H01L 27/0629 257/334 |
| 2016/0218008 A1* | 7/2016 | Li ........................ H01L 29/4236 |

* cited by examiner

*Primary Examiner* — J.E. Schoenholtz
(74) *Attorney, Agent, or Firm* — Murtha Cullina LLP

(57) ABSTRACT

A trench-gate MOSFET is disclosed. A plurality of trenches penetrating through a well region are formed in a semiconductor substrate, and horizontal widths of the trenches are defined by first openings formed. The trenches are filled with polysilicon gates. The first openings at the tops of the polysilicon gates are filled with a first dielectric layer. Under the self-alignment definition of the first dielectric layer, the portions, between the first openings, of the hard mask layer are removed to form second openings. First inner spacers are formed through self-alignment on inner sides of the second openings, and the second openings are narrowed by the first inner spacers to form third openings. The third openings are filled with a metal layer, so that a source contact hole is formed through self-alignment at the top of the source region. A method for manufacturing a trench-gate MOSFET is further disclosed.

15 Claims, 14 Drawing Sheets

TRENCH-GATE MOSFET AND METHOD FOR MANUFACTURING SAME

CROSS-REFERENCE TO RELATED APPLICATION

This application claims the priority of Chinese patent application number 201810984537.4, filed on Aug. 28, 2018, the entire contents of which are incorporated herein by reference.

BACKGROUND OF THE INVENTION

Technical Field

The invention relates to the field of manufacturing of semiconductor integrated circuits, in particular to a trench-gate metal-oxide semiconductor field-effect transistor (MOSFET) and a method for manufacturing a trench-gate MOSFET.

Description of Related Art

FIGS. 1A-1L are views of device structures in all steps of a method for manufacturing an existing trench-gate MOSFET. As shown in FIGS. 1A-1L, the method for manufacturing the existing trench-gate MOSFET comprises the following steps:

Step 1, as shown in FIG. 1A, a semiconductor substrate such as a silicon substrate 101 is provided, and a hard mask structure 102 is formed on the surface of the semiconductor substrate 101, wherein the hard mask structure 102 is an oxide layer or is formed by an oxide layer and a nitride layer.

Step 2, as shown in FIG. 1B, the hard mask structure 102 is etched through a photo-etching process to define a gate formation area, and then, the semiconductor substrate 101 is etched with the hard mask structure 102 as a mask to form trenches 103.

Wherein, the trench-gate MOSFET comprises a current flow region and a gate lead-out region located outside the current flow region, the trench in the gate lead-out region is independently represented by reference sign 103a, and it thus can be seen that the trench 103a in the gate lead-out region is communicated with the trenches 103 in the current flow region.

As shown in FIG. 1C, the hard mask structure 102 is removed.

Step 3, as shown in FIG. 1D, a gate dielectric layer such as a gate oxide layer 104 is formed on side faces and bottom surfaces of the trenches 103.

Step 4, as shown in FIG. 1E, the trenches 103 and 103a are filled with polysilicon to form polysilicon gates 105, wherein the polysilicon gate 105 in the gate lead-out region is connected with the polysilicon gates 105 in the current flow region.

Step 5, as shown in FIG. 1F, the polysilicon gates 105 are etched back.

Step 6, as shown in FIG. 1F, a well region 106 of a first conduction type is formed on the surface of the portion, located in the current flow region, of the semiconductor substrate 101, and a source region 107 formed by a heavily-doped region of a second conduction type is formed on the surface of the well region, wherein as for an N-type trench-gate MOSFET, the first conduction type is a P type, and the second conduction type is an N type; as for a P-type trench-gate MOSFET, the first conduction type is an N type, and the second conduction type is a P type.

Step 7, as shown in FIG. 1G, an interlayer film 108 is formed.

Step 8, contact holes 109a and 109b penetrating through the interlayer film 108 are formed, wherein the contact hole 109a is a source contact hole, and the contact hole 109b is a gate contact hole; FIG. 1H shows the state of the contact holes 109a and 109b after the interlayer film 108 is etched and before the contact holes 109a and 109b are filled with metals, and FIG. 1I shows the state of the contact holes 109a and 109b after the contact holes 109a and 109b are filled with metals.

Step 9, a front metal layer 110 is formed, as shown in FIG. 1J, and the front metal layer 110 is photo-etched to form a source electrode and a gate electrode, as shown in FIG. 1K, wherein the top of the contact hole 109b is connected with the gate electrode, and the top of the contact hole 109a is connected with the source electrode.

Step 10, as shown in FIG. 1L, a drain region formed by a heavily-doped region of the second conduction type is formed on the back of the semiconductor substrate 101, and a back metal layer 111 is formed on the back of the drain region and is used as a drain electrode.

The well region 106 and the source region 107 are formed in the current flow region of the trench-gate MOSFET, and when the working voltage of the polysilicon gates 105 is higher than a threshold voltage, channels will be formed on the surface, covered by the side faces of the polysilicon gates 105, of the well region 106, and a source-drain current region is also formed. The current flow region is formed by a plurality of cell structures, which are connected in parallel, of the trench-gate MOSFET. Generally, the trenches 103 in the current flow region are parallelly arrayed at equal intervals, and the sum of the width of the trenches 103 and the interval between the trenches 103 is the pitch of the cell structures of the trench-gate MOSFET, namely the pitch of the polysilicon gates 105. The number of channels of the trench-gate MOSFET can be increased by decreasing the pitch of the polysilicon gates 105, which will in turn realize a low on-resistance of the trench-gate MOSFET. However, with the decrease of the pitch of the trench-gate MOSFET, it becomes more and more difficult to form the source contact hole 109a due to the fact that the source contact hole 109a is defined through photo-etching in the prior art, and when the pitch is decreased, electric leakage between the gate and the source is hard to restrain, which means that the electric leakage between the gate and the source will be increased, and consequentially, further decrease of the pitch of the trench-gate MOSFET is limited.

BRIEF SUMMARY OF THE INVENTION

A technical issue to be addressed by the invention to decrease the pitch of the cell structures in the flow current region of trench-gate MOSFETs so as to improve the integration level and performance of the trench-gate MOSFETs by providing a trench-gate MOSFET and a method for manufacturing a trench-gate MOSFET.

To address the above technical issue, the invention provides a trench-gate MOSFET. A well region of a first conduction type is formed on the surface of a semiconductor substrate in a current flow region of the trench-gate MOSFET. A source region formed by a heavily-doped region of a second conduction type is formed on the surface of the well region.

A plurality of trenches are formed in the semiconductor substrate and penetrate through the well region in the longitudinal direction. Horizontal widths of the trenches are defined by first openings which are formed by photo-etching a hard mask structure.

A gate dielectric layer is formed on side faces and bottom surfaces of the trenches. The trenches are filled with polysilicon gates formed by polysilicon.

The first openings at the tops of the polysilicon gates are filled with a first dielectric layer, and the first dielectric layer and the hard mask structure are made from different materials. Under the self-alignment definition of the first dielectric layer, the portions, between the first openings, of the hard mask structure are removed to form second openings.

First inner spacers formed by a second dielectric layer are formed through self-alignment on the inner sides of the second openings, and the second openings are narrowed by the first inner spacers to form third openings.

Materials, at the bottoms of the third openings, of the semiconductor substrate are removed through self-alignment to allow the bottoms of the third openings to penetrate through the source region and to extend into the well region. The third openings extending into the well region are filled with a metal layer, so that a source contact hole is formed through self-alignment at the top of the source region. The self-alignment structure of the source contact hole decreases the pitch of cell structures in the current flow region of the trench-gate MOSFET, thus, improving the integration level of the trench-gate MOSFET.

Furthermore, a gate lead-out region is formed outside the current flow region of the trench-gate MOSFET. The trench in the gate lead-out region is communicated with the trenches in the current flow region, and the polysilicon gate in the gate lead-out region is connected with the polysilicon gates in the current flow region.

The well region extends into the gate lead-out region, and the source region is not formed on the surface of the well region in the gate lead-out region.

The first opening at the top of the polysilicon gate in the gate lead-out region is fully filled with the first dielectric layer to form a fourth opening. The fourth opening is defined through photo-etching and penetrates through the first dielectric layer in the gate lead-out region. The bottom of the fourth opening extends into the corresponding polysilicon gate, and the fourth opening extending into the corresponding polysilicon gate is filled with a metal layer, so that a gate contact hole is formed.

Furthermore, a source electrode formed by patterning a front metal layer is formed at the top of the source contact hole, and a gate electrode formed by patterning the front metal layer is formed at the top of the gate contact hole.

Furthermore, a heavily-doped well contact region of the first conduction type is formed in the well region at the bottom of the source contact hole and makes contact with the bottom of the source contact hole.

Furthermore, a drain region formed by a heavily-doped region of the second conduction type is formed on the back of the semiconductor substrate, and a drain electrode formed by a back metal layer is formed on the back of the drain region.

Furthermore, the semiconductor substrate is a silicon substrate.

Furthermore, the hard mask structure is formed by a first oxide layer, a second nitride layer and a third oxide layer which are stacked together.

The first dielectric layer is formed by a fourth oxide layer.

The second dielectric layer is formed by a fifth oxide layer.

Furthermore, the gate dielectric layer is a gate oxide layer.

To settle the above technical issue, the invention provides a method for manufacturing a trench-gate MOSFET. The method comprises the following steps:

Step 1, providing a semiconductor substrate, and forming a well region of a first conduction type in the semiconductor substrate;

Step 2, forming a hard mask structure on the surface of the portion, formed with the well region, of the semiconductor substrate;

Step 3, defining formation areas of trenches through photo-etching, etching the hard mask structure to form first openings, and under the definition of the first openings, etching the portions, at the bottoms of the first openings, of the semiconductor substrate to form the trenches, wherein the number of the trenches is more than one, and the trenches penetrate through the well region in the longitudinal direction;

Step 4, forming a gate dielectric layer on side faces and bottom surfaces of the trenches, and filling the trenches with polysilicon gates formed by polysilicon, wherein the back-etched surfaces of the polysilicon gates are flush with the surface of the semiconductor substrate and completely open the first openings;

Step 5, filling the first openings at the tops of the polysilicon gates with a first dielectric layer through deposition and back-etching, wherein the first dielectric layer and the hard mask structure are made from different materials;

Step 6, removing the portions, between the first openings, of the hard mask structure under the self-alignment definition of the first dielectric layer to form second openings;

Step 7, carrying out heavily-doped ion implantation of a second conduction type to form a source region on the surface of the well region in the current flow region of the trench-gate MOSFET;

Step 8, depositing a second dielectric layer, comprehensively etching the second dielectric layer to form first inner spacers on the inner sides of the second openings through self-alignment, and narrowing the second openings by the first inner spacers to form third openings, wherein the first inner spacers are formed by the second dielectric layer;

Step 9, carrying out self-alignment etching on the portions, at the bottoms of the third openings, of the semiconductor substrate to allow the bottoms of the third openings to penetrate through the source region and to extend into the well region; and Step 10, filling the third openings with a metal layer to form a source contact hole through self-alignment at the top of the source region, wherein the self-alignment structure of the source contact hole decreases the pitch of cell structures in the current flow region of the trench-gate MOSFET, thus, improving the integration level of the trench-gate MOSFET.

Furthermore, a gate lead-out region is formed outside the current flow region of the trench-gate MOSFET; the trench in the gate lead-out region and the trenches in the current flow region are formed at the same time and are communicated; the portion, in the gate lead-out region, of the gate dielectric layer and the portion, in the current flow region, of the gate dielectric layer are formed at the same time; and the polysilicon gate in the trench in the gate lead-out region and the polysilicon gates in the trenches in the current flow region are formed at the same time.

In Step 7, the source region is not formed on the surface of the well region in the gate lead-out region.

After the second dielectric layer is deposited in Step 8, the method further comprises the Step: carrying out photo-etching to form a fourth opening at the top of the polysilicon gate in the gate lead-out region, wherein the fourth opening penetrates through the second dielectric layer and the portion, in the corresponding first opening, of the first dielectric layer located at the bottom of the second dielectric layer.

Afterwards, the portion, at the top of the first opening in the gate lead-out region, of the second dielectric layer is completely removed while the second dielectric layer is comprehensively etched to form the first inner spacers, so that the fourth opening only penetrates through the first dielectric layer.

In Step 9, self-alignment etching is carried out on the polysilicon gate at the bottom of the fourth opening while self-alignment etching is carried out on the portions, at the bottoms of the third openings, of the semiconductor substrate, so that the bottom of the fourth opening extends into the corresponding polysilicon gate.

In Step 10, the fourth opening is filled with a metal layer, so that a gate contact hole is formed.

Furthermore, the method further comprises the following steps:

Step 11, forming a front metal layer, and patterning the front metal layer through photo-etching to form a source electrode and a gate electrode, wherein the top of the source contact hole makes contact with the source electrode, and the top of the gate contact hole makes contact with the gate electrode; and Step 12, forming a drain region formed by a heavily-doped region of the second conduction type on the back of the semiconductor substrate, forming a back metal layer on the back of the drain region, and forming a drain electrode by the back metal layer.

Furthermore, after Step 9 is completed, the method further comprises the Step: carrying out heavily-doped implantation of the first conduction type to form a well contact region in the well region at the bottom of the source contact hole, wherein the well contact hole makes contact with the bottom of the source contact hole.

Furthermore, the semiconductor substrate is a silicon substrate.

Furthermore, the hard mask structure is formed by a first oxide layer, a second nitride layer and a third oxide layer which are stacked together.

The first dielectric layer is formed by a fourth oxide layer.

The second dielectric layer is formed by a fifth oxide layer.

Furthermore, the gate dielectric layer is a gate oxide layer.

According to the invention, the hard mask structure is used for defining the trenches, the first openings at the tops of the polysilicon gates filled in the trenches are filled with the first dielectric layer, and the first dielectric layer and the hard mask structure are made from different materials, so that the hard mask structure can be removed through self-alignment to form the second openings; the first inner spacers are formed through self-alignment on the inner sides of the second openings, the second openings are narrowed by the first inner spacers to form the third openings which can define the formation area of the source contact hole through self-alignment, and the third openings are filled with the metal layer to form the source contact hole. In this way, the horizontal position of the source contact hole is defined through the self-alignment process without the photo-etching process. As the self-alignment process can prevent overlay errors caused by the photo-etching process, the interval between the trenches in the current flow region is minimized, the pitch of the cell structures in the current flow region of the trench-gate MOSFET is decreased, and thus, the integration level of the trench-gate MOSFET is improved. By decreasing the pitch of the cell structures in the current flow region of the trench-gate MOSFET, the density of channels is improved, and thus, the on-resistance of the device is reduced, and the performance of the device is improved. In addition, a photomask used for defining the source contact hole is omitted in this embodiment, and thus, the cost is reduced.

BRIEF DESCRIPTION OF THE DRAWINGS

The invention is further expounded below with reference to the accompanying drawings and specific embodiments.

DETAILED DESCRIPTION OF THE INVENTION

Figure 1A:
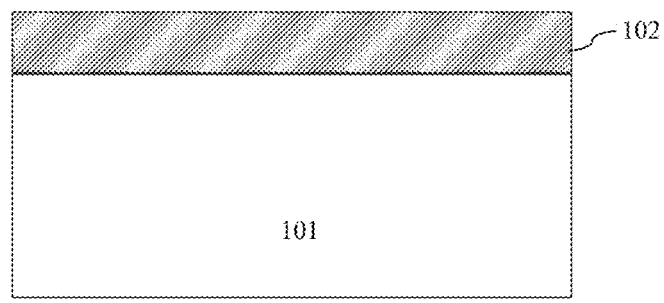
FIGS. 1A-1L are views of device structures in all steps of a method for manufacturing an existing trench-gate MOSFET.
Figure 1B:
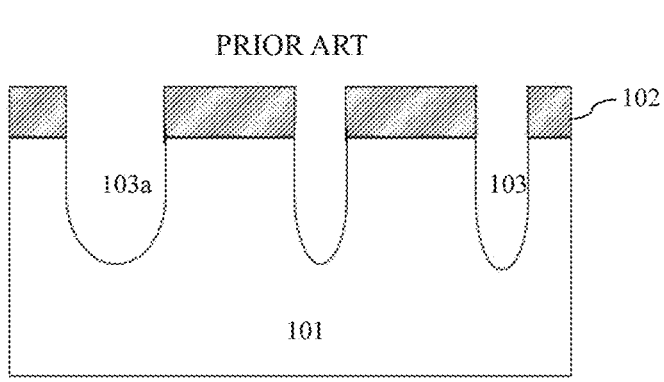
Figure 1C:
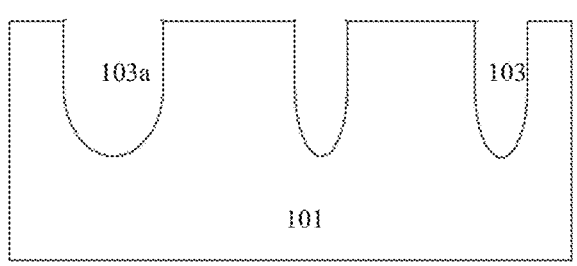
Figure 1D:
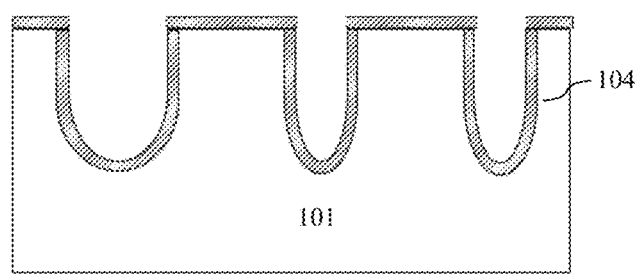
Figure 1E:
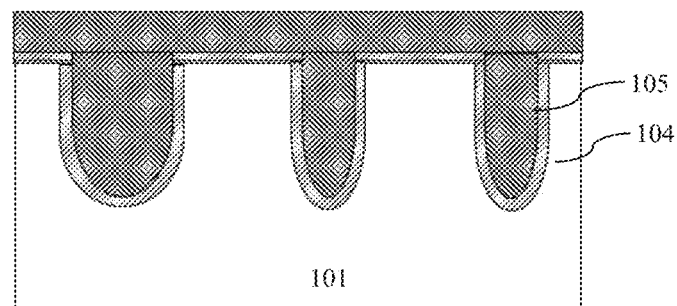
Figure 1F:
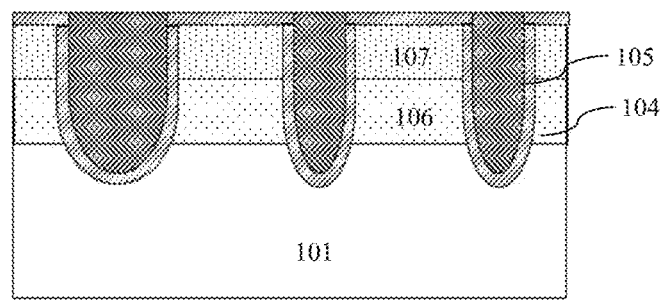
Figure 1G:
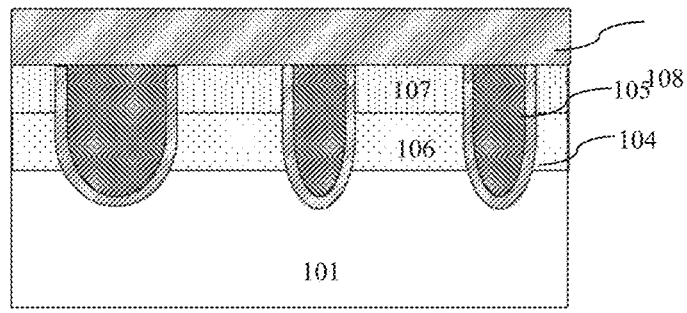
Figure 1H:
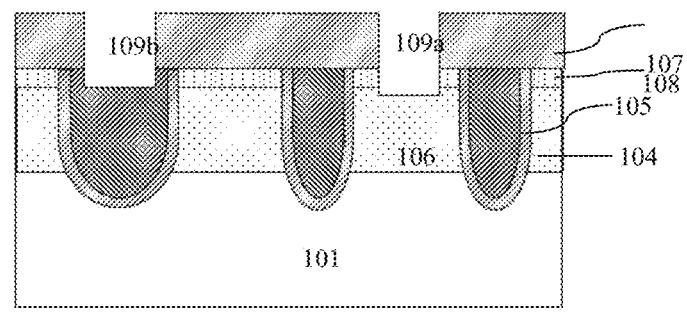
Figure 1I:
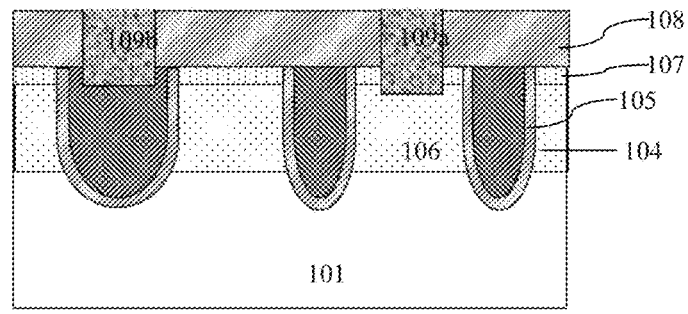
Figure 1J:
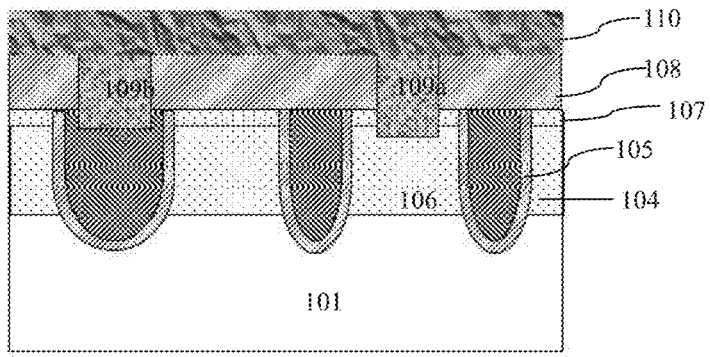
Figure 1K:
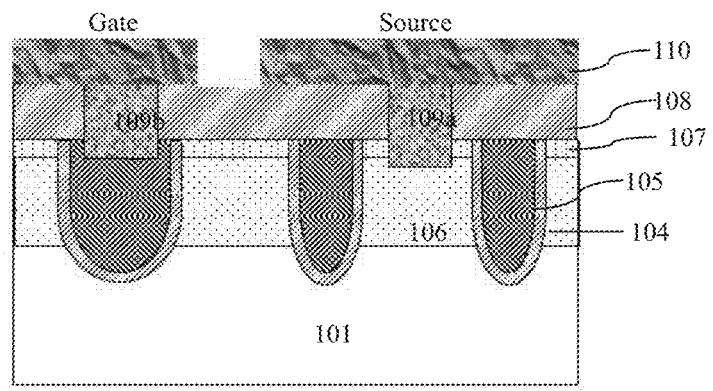
Figure 1L:
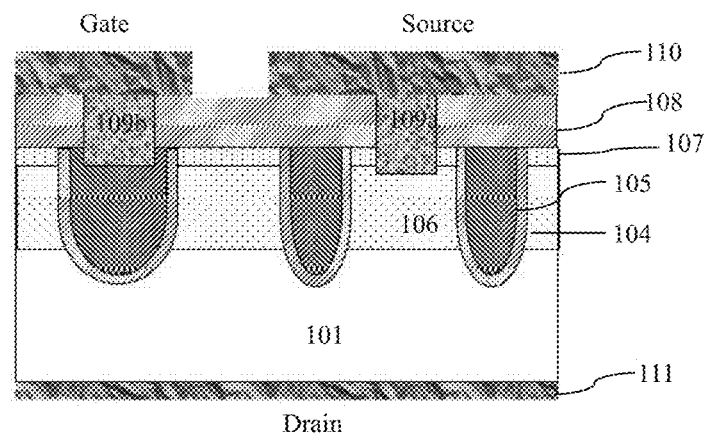
Figure 2:
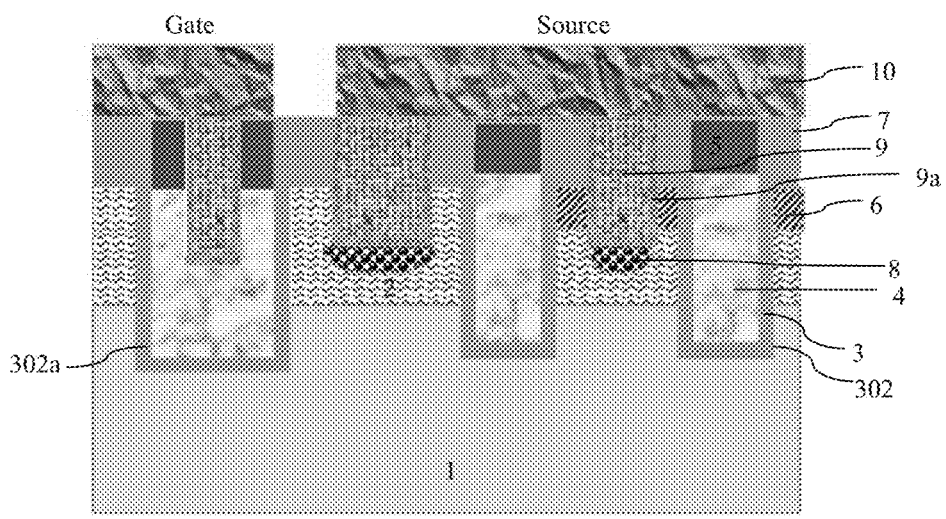
FIG. 2 is a structural view of a trench-gate MOSFET in one embodiment of the invention.

FIG. 2 is a structural view of a trench-gate MOSFET in one embodiment of the invention. In this embodiment of the invention, a well region 2 of a first conduction type is formed on the surface of a semiconductor substrate 1 in a current flow region of the trench-gate MOSFET. A source region 6 formed by a heavily-doped region of a second conduction type is formed on the surface of the well region 2.

A plurality of trenches 302 are formed in the semiconductor substrate 1 and penetrate through the well region 2 in the longitudinal direction. Horizontal widths of the trenches 302 are defined by the first openings 301 which are formed by photo-etching a hard mask structure 202. Please refer to FIG. 3D for the first openings 301.

A gate dielectric layer 3 is formed on side faces and bottom surfaces of the trenches 302, and the trenches 302 are filled with polysilicon gates 4 formed by polysilicon.

The first openings 301 at the tops of the polysilicon gates 4 are filled with a first dielectric layer 5. The first dielectric layer 5 and the hard mask structure 202 are made from different materials. Under the self-alignment definition of the first dielectric layer 5, the portions, between the first openings 301, of the hard mask structure 202 are removed to form second openings 303. Please refer to FIG. 3L for the second openings 303.

First inner spacers 7 formed by a second dielectric layer 7 are formed through self-alignment on the inner sides of the second openings 303. The second openings 303 are narrowed by the first inner spacers 7 to form third openings 305. Please refer to FIG. 3P for the third openings 305.

Materials, at the bottoms of the third openings 305, of the semiconductor substrate 1 are removed through self-alignment to allow the bottoms of the third openings 305 to penetrate through the source region 6 and to extend into the well region 2. The third openings 305 extending into the well region 2 are filled with a metal layer 9, so that a source contact hole is formed through self-alignment at the top of the source region 6. The self-alignment structure of the source contact hole decreases the pitch of cell structures in the current flow region of the trench-gate MOSFET, thereby improving the integration level of the trench-gate MOSFET. In this embodiment, a gate lead-out region is formed outside the current flow region of the trench-gate MOSFET, and the trench in the gate lead-out region is independently represented by reference sign 302a. The trench 302a in the gate lead-out region is communicated with the trenches 302 in the current flow region, and the polysilicon gate 4 in the gate lead-out region is connected with the polysilicon gates 4 in the current flow region.

The well region 2 extends into the gate lead-out region, and the source region 6 is not formed on the surface of the well region 2 in the gate lead-out region.

The first opening 301 at the top of the polysilicon gate 4 in the gate lead-out region is fully filled with the first dielectric layer 5 to form a fourth opening 304. The fourth opening 304 is defined through photo-etching and penetrates through the first dielectric layer 5. The bottom of the fourth opening 304 extends into the corresponding polysilicon gate 4, and the fourth opening 304 extending into the corresponding polysilicon gate 4 is filled with the metal layer 9, so that a gate contact hole is formed. Please refer to FIG. 3N for the fourth opening 304. The metal layer 9 in the source contact hole and the gate contact hole is generally made from metallic tungsten, and a barrier layer and an adhesion layer 9a are formed between the metallic tungsten and the semiconductor substrate 1.

A source electrode formed by patterning a front metal layer 10 is formed at the top of the source contact hole, and a gate electrode formed by patterning the front metal layer 10 is formed at the top of the gate contact hole.

A heavily-doped well contact region 8 of the first conduction type is formed in the portion, at the bottom of the source contact hole, of the well region 2, and the well contact region 8 makes contact with the bottom of the source contact hole.

A drain region formed by a heavily-doped region of the second conduction type is formed on the back of the semiconductor substrate 1, and a drain electrode formed by a back metal layer is formed on the back of the drain region.

In this embodiment, the semiconductor substrate 1 is a silicon substrate.

The hard mask structure 202 is formed by a first oxide layer 202a, a second nitride layer 202b and a third oxide layer 202c which are stacked together.

The first dielectric layer 5 is formed by a fourth oxide layer.

The second dielectric layer 7 is formed by a fifth oxide layer.

Furthermore, the gate dielectric layer 3 is a gate oxide layer.

In this embodiment, the trench-gate MOSFET is an N-type device, the first conduction type is a P type, and the second conduction type is an N type. In other embodiments, the trench-gate MOSFET may be a P-type device, the first conduction type is an N type, and the second conduction type is a P type.

In this embodiment of the invention, the hard mask structure 202 is used for defining the trenches 302, the first openings 301 at the tops of the polysilicon gates 4 filled in the trenches 302 are filled with the first dielectric layer 5, and the first dielectric layer 5 and the hard mask structure 202 are made from different materials, so that the hard mask structure 202 can be removed through self-alignment to form the second openings 303; the first inner spacers 7 are formed through self-alignment on the inner sides of the second openings 303, the second openings 303 are narrowed by the first inner spacers 7 to form the third openings 305 which can define the formation area of the source contact hole through self-alignment, and the third openings 305 are filled with the metal layer to form the source contact hole. In this way, the horizontal position of the source contact hole is defined through the self-alignment process without the photo-etching process. As the self-alignment process can prevent overlay errors caused by the photo-etching process, the interval between the trenches 302 in the current flow region is minimized, the pitch of the cell structures in the current flow region of the trench-gate MOSFET is decreased, and thus, the integration level of the trench-gate MOSFET is improved. By decreasing the pitch of the cell structures in the current flow region of the trench-gate MOSFET, the density of channels is improved, and thus, the on-resistance of the device is reduced, and the performance of the device is improved. In addition, a photomask used for defining the source contact hole is omitted in this embodiment, and thus, the cost is reduced.

Figure 3A:
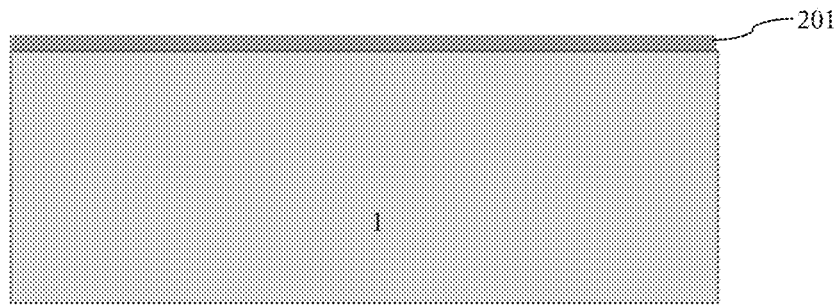
FIGS. 3A-3T are views of device structures in all steps of a method for manufacturing a trench-gate MOSFET in one embodiment of the invention.
Figure 3B:
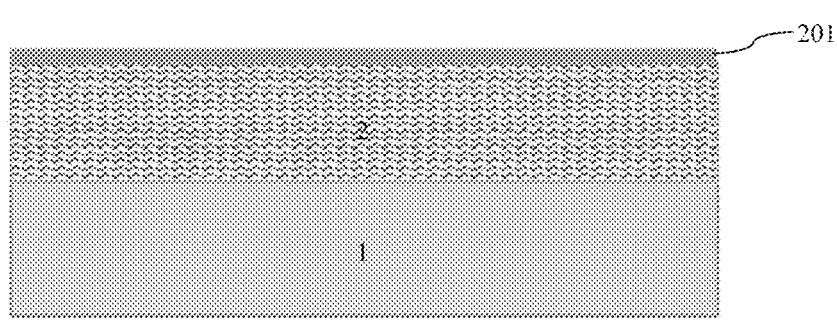
Figure 3C:
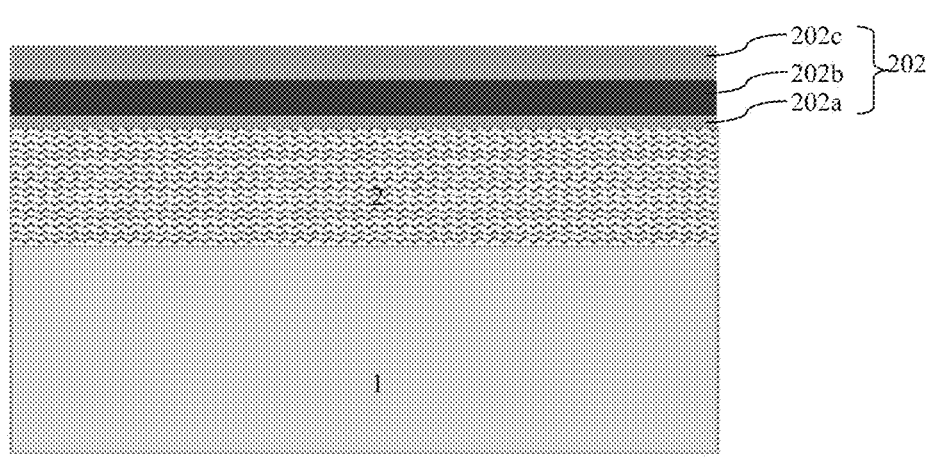
Figure 3D:
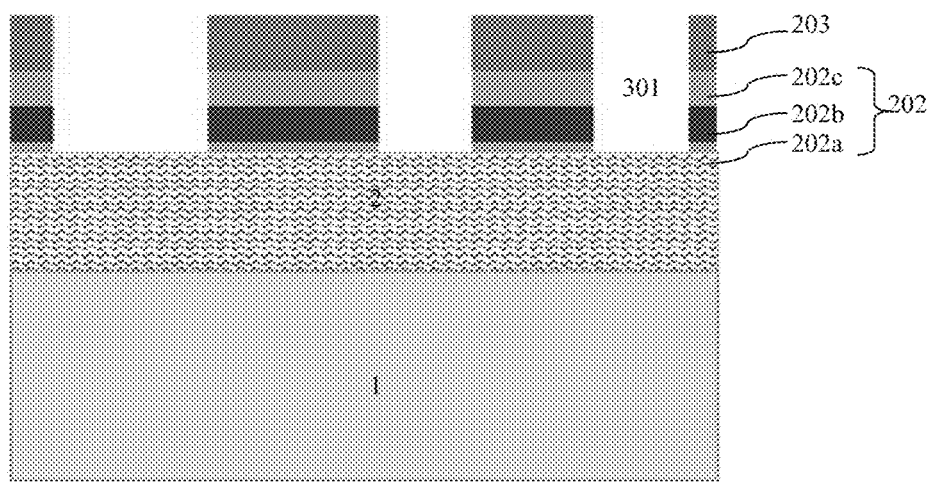
Figure 3E:
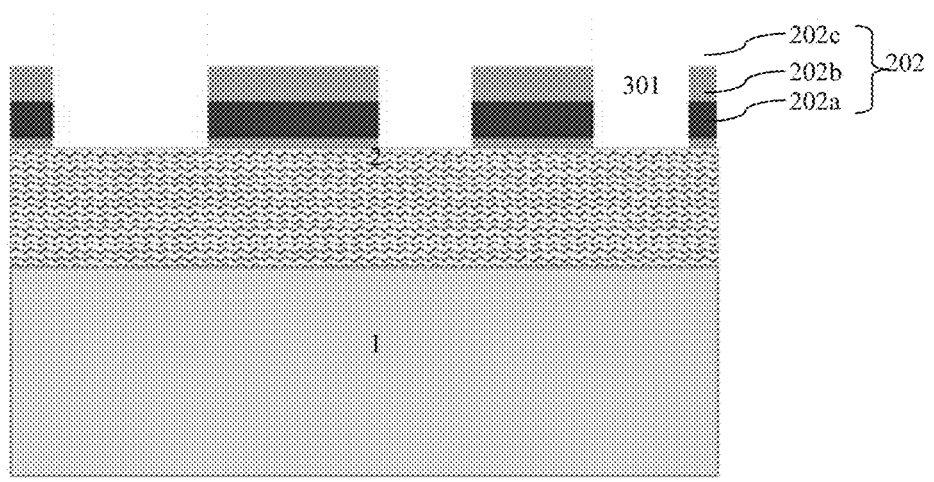
Figure 3F:
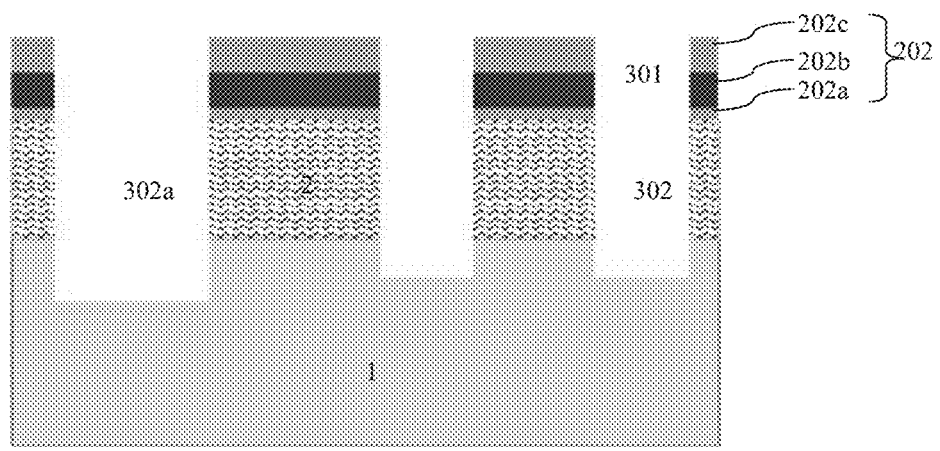
Figure 3G:
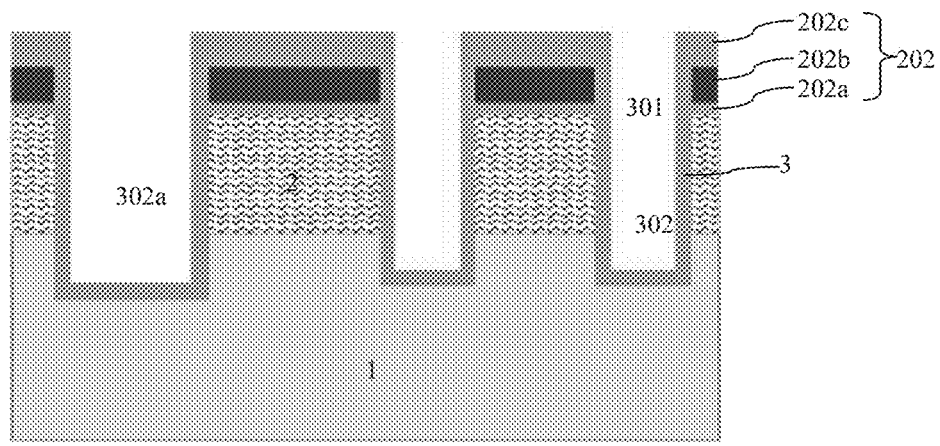
Figure 3H:
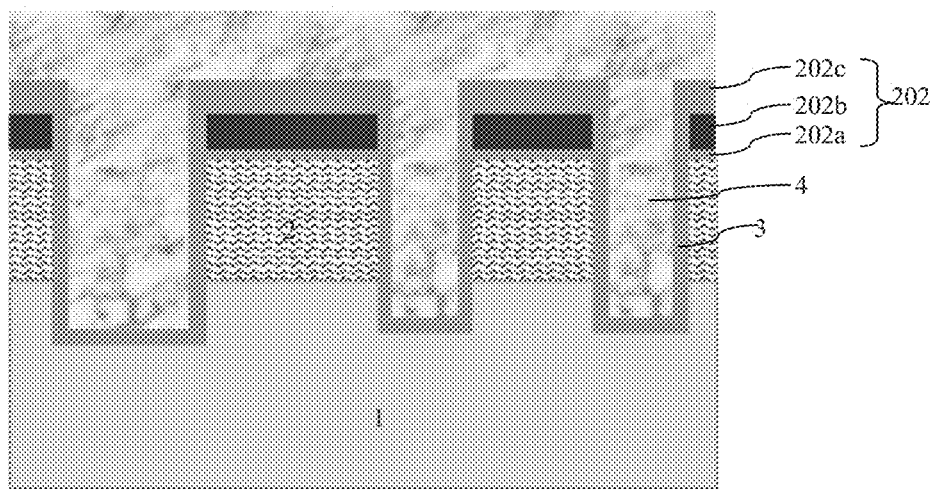
Figure 3I:
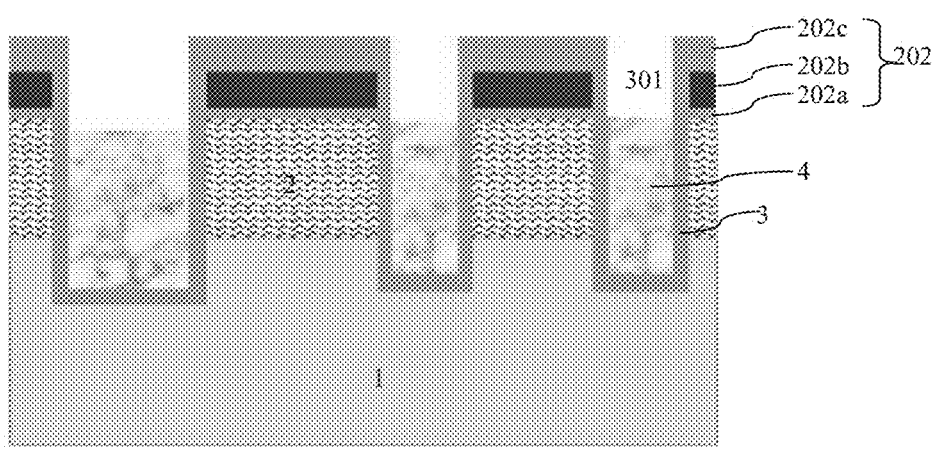
Figure 3J:
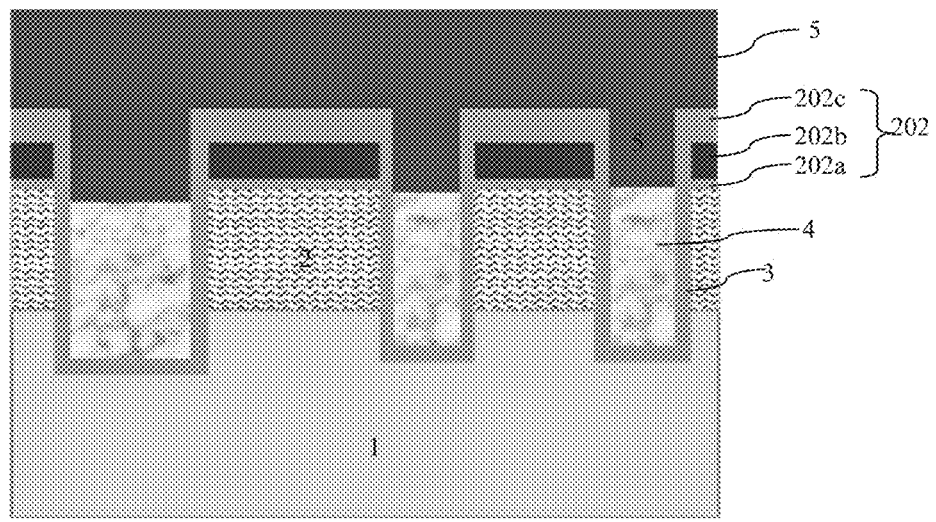
Figure 3K:
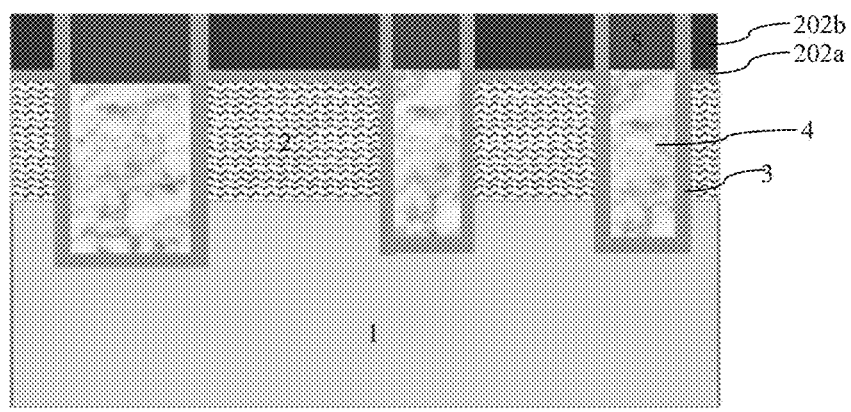
Figure 3L:
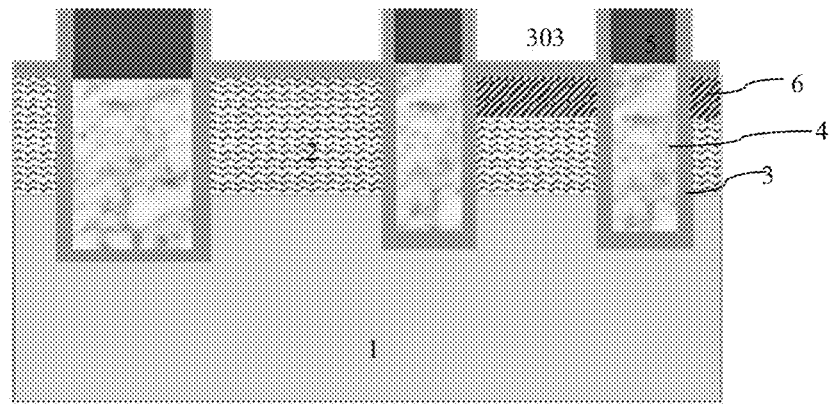
Figure 3M:
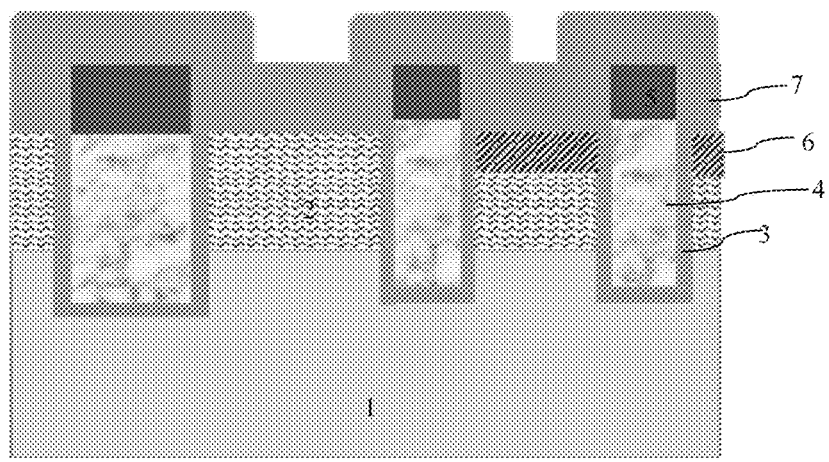
Figure 3N:
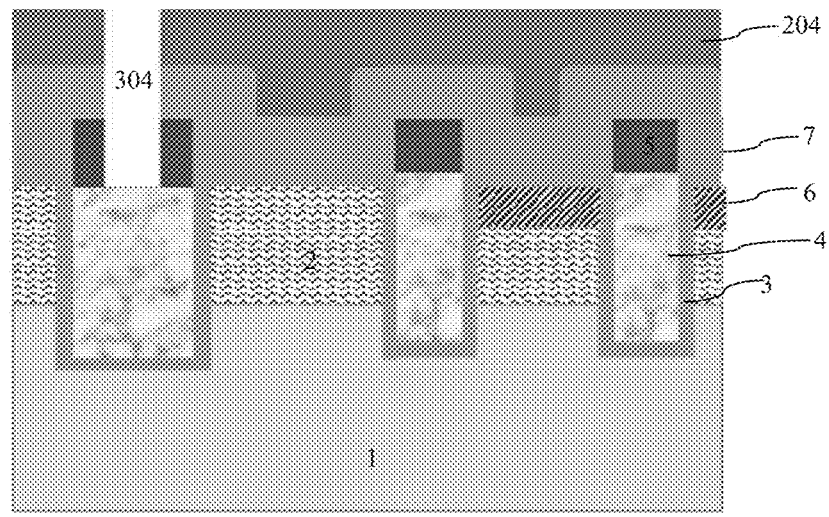
Figure 3O:
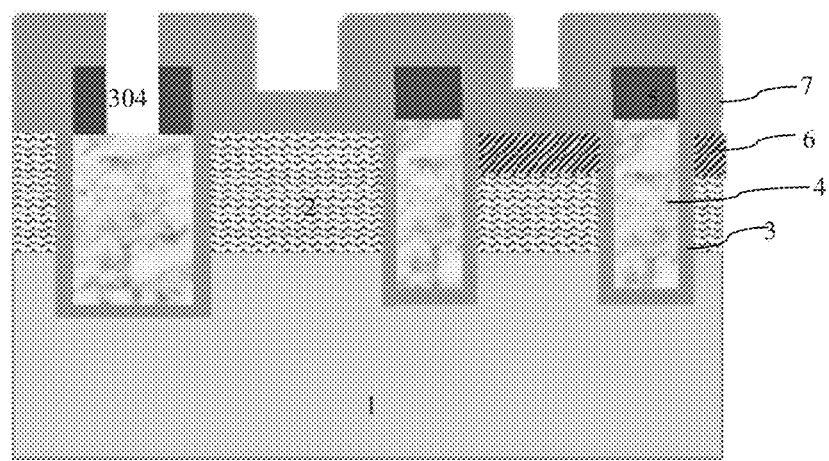
Figure 3P:
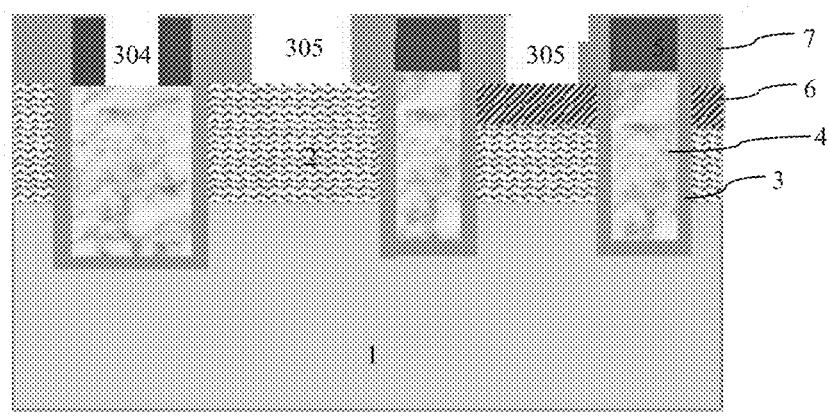
Figure 3Q:
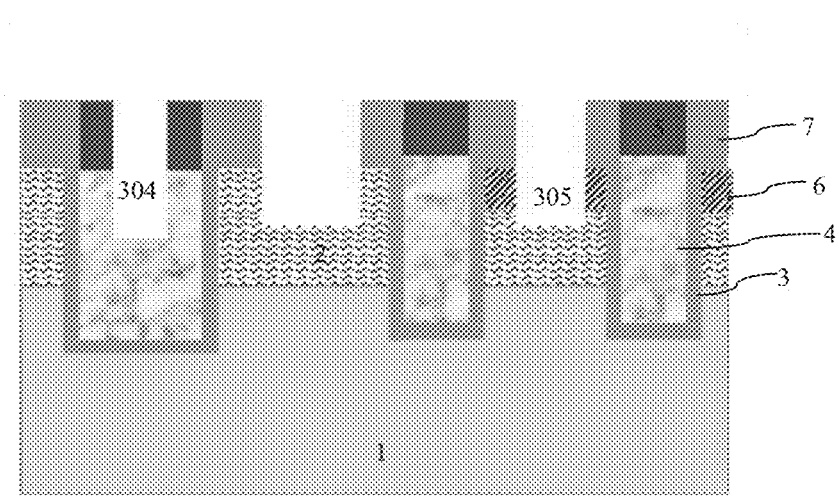
Figure 3R:
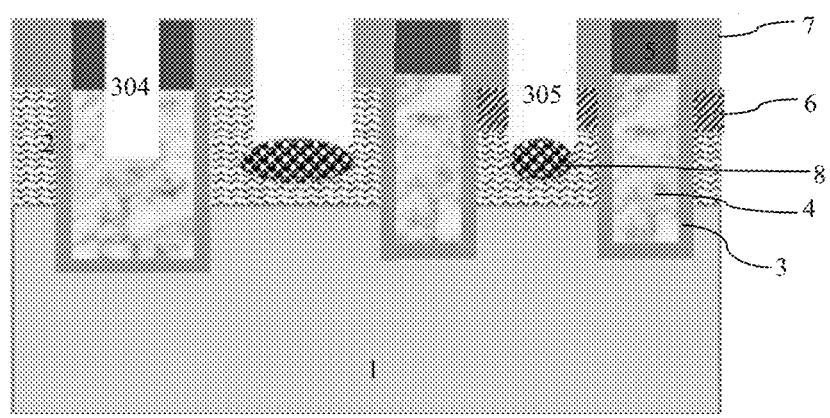
Figure 3S:
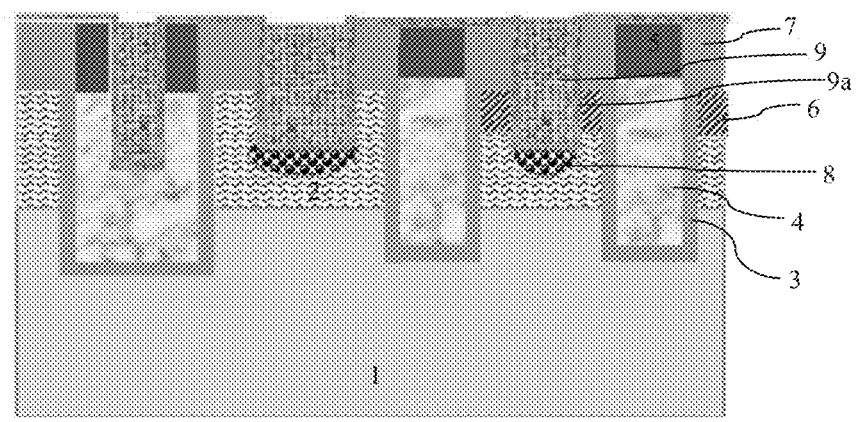
Figure 3T:
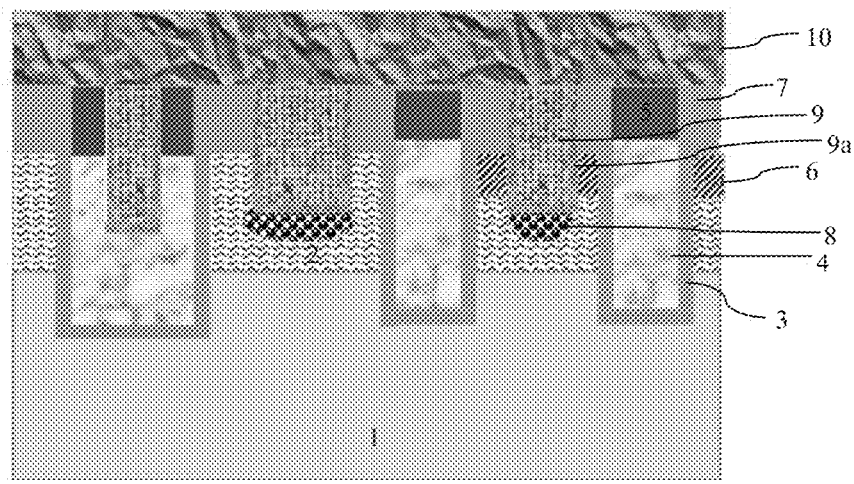

FIGS. 3A-3T are views of device structures in all steps of a method for manufacturing a trench-gate MOSFET in one embodiment of the invention. In this embodiment, the method for manufacturing a trench-gate MOSFET comprises the following steps:

Step 1, a semiconductor substrate 1 is provided, and a well region 2 of a first conduction type is formed in the semiconductor substrate 1, wherein as shown in FIG. 3A, the well region 2 is formed through ion implantation and annealing, and before ion implantation of the well region 2, a screen oxide 201 is formed on the surface of the semiconductor substrate 1; then, ion implantation and annealing drive-in of the well region 2 are carried out, as shown in FIG. 3B.

Afterwards, the screen oxide 201 is removed, wherein the screen oxide 201 has a thickness of about 300 Å.

Step 2, as shown in FIG. 3C, a hard mask structure 202 is formed on the surface of the portion, formed with the well region 2, of the semiconductor substrate 1.

Step 3, as shown in FIG. 3D, a photoresist pattern 203 is formed through photo-etching, and formation areas of trenches 302 are defined by the photoresist pattern 203.

The hard mask structure 202 is etched to form first openings 301, and afterwards, the photoresist pattern 203 is removed, as shown in FIG. 3E.

As shown in FIG. 3F, under the definition of the first openings 301, the portions, at the bottoms of the first openings 301, of the semiconductor substrate 1 are etched to form the trenches 302, wherein the number of the trenches 302 is more than one, and the trenches 302 penetrate through the well region 2 in the longitudinal direction.

As for the method in this embodiment, a gate lead-out region is formed outside a current flow region of the trench-gate MOSFET, the trench 302a in the gate lead-out region and the trenches 302 in the current flow region are formed at the same time and are communicated.

Step 4, as shown in FIG. 3G, a gate dielectric layer 3 is formed on side faces and bottom surfaces of the trenches 302.

As shown in FIG. 3H, the trenches 302 are filled with polysilicon gates 4 formed by polysilicon, wherein the polysilicon constituting the polysilicon gates 4 is formed through deposition; afterwards, the polysilicon is etched back till the back-etched surfaces of the polysilicon gates 4 are flush with the surface of the semiconductor substrate 1 and completely open the first openings 301, as shown in FIG. 3I.

As for the method in this embodiment, the portion, in the trench 302a in the gate lead-out region, of the gate dielectric layer 3 and the portion, in the trenches 302 in the current flow region, of the gate dielectric layer 3 are formed at the same time, and the polysilicon gate 4 in the trench 302a in the gate lead-out region and the polysilicon gates 4 in the trenches 302 in the current flow region are formed at the same time.

Step 5, as shown in FIG. 3J, the first openings 301 at the tops of the polysilicon gates 4 are filled with a first dielectric layer 5 through deposition and back-etching, wherein the first dielectric layer 5 and the hard mask structure 202 are made from different materials. FIG. 3J is a view of the device structure after the first dielectric layer 5 is formed through deposition. FIG. 3K is a view of the device structure after the first dielectric layer 5 is etched back. Back-etching of the first dielectric layer 5 is implemented through etching or chemical mechanical polishing (CMP).

Step 6, as shown in FIG. 3L, under the self-alignment definition of the first dielectric layer 5, the portions, between the first openings 301, of the hard mask structure 202 are removed to form second openings 303.

Step 7, as shown in FIG. 3L, heavily-doped ion implantation of a second conduction type is carried out to form a source region 6 on the surface of the well region 2 in the current flow region of the trench-gate MOSFET.

As for the method in this embodiment, the source region 6 is not formed on the surface of the well region 2 in the gate lead-out region.

Step 8, as shown in FIG. 3M, a second dielectric layer 7 is deposited and is comprehensively etched to form first inner spacers 7 through self-alignment on the inner sides of the second openings 303, and the second openings 303 are narrowed by the first inner spacers 7 to form third openings 305, wherein the first inner spacers 7 are formed by the second dielectric layer 7.

In this embodiment, after the second dielectric layer 7 is deposited, the method further comprises the following steps:

As shown in FIG. 3N, photo-etching is carried out to form a photoresist pattern 204, etching is carried out under the definition of the photoresist pattern 204 to form a fourth opening 304 at the top of the polysilicon gate 4 in the gate lead-out region, wherein the fourth opening 304 penetrates through the second dielectric layer 7 and the portion, in the corresponding first opening 301, of the first dielectric layer 5 located at the bottom of the second dielectric layer 7. Afterwards, the photoresist pattern 204 is removed, as shown in FIG. 3O.

As shown in FIG. 3P, the portion, at the top of the first opening 301 in the gate lead-out region, of the second dielectric layer 7 is removed while the second dielectric layer 7 is comprehensively etched to form the first inner spacers 7, so that the fourth opening 304 only penetrates through the first dielectric layer 5.

Step 9, as shown in FIG. 3Q, self-alignment etching is carried out on the portions, at the bottoms of the third openings 305, of the semiconductor substrate 1 to allow the bottoms of the third openings 305 to penetrate through the source region 6 and to extend into the well region 2.

As for the method in this embodiment, self-alignment etching is carried out on the polysilicon gate 4 at the bottom of the fourth opening 304 to allow the bottom of the fourth opening 304 to extend into the corresponding polysilicon gate 4 while self-alignment etching is carried out on the portions, at the bottoms of the third openings 305, of the semiconductor substrate 1.

In this embodiment, as shown in FIG. 3R, after the third openings 305 are formed, the method further comprises the Step: heavily-doped implantation of the first conduction type is carried out to form a well contact region 8 in the well region 2 at the bottom of the source contact hole, wherein the well contact region 8 makes contact with the bottom of the source contact hole.

Step 10, as shown in FIG. 3S, the third openings 305 are filled with a metal layer 9, so that a source contact hole is formed through self-alignment at the top of the source region 6, wherein the self-alignment structure of the source contact hole decreases the pitch of cell structures in the current flow region of the trench-gate MOSFET, thus, improving the integration level of the trench-gate MOSFET. In this embodiment, the metal layer 9 in the source contact hole is generally made from metallic tungsten. Before the source contact hole is filled with metallic tungsten, a barrier layer and an adhesion layer 9a are formed.

As for the method in this embodiment, the fourth opening 304 is filled with a metal layer 9, so that a gate contact hole is formed.

The method further comprises the following steps:

Step 11, a front metal layer 10 is formed and is patterned through photo-etching to form a source electrode and a gate electrode, wherein the top of the source contact hole makes contact with the source electrode, and the top of the gate contact hole makes contact with the gate electrode.

Step 12, a drain region formed by a heavily-doped region of the second conduction type is formed on the back of the semiconductor substrate 1, a back metal layer is formed on the back of the drain region, and a drain electrode is formed by the back metal layer.

As for the method in this embodiment, the semiconductor substrate 1 is a silicon substrate.

The hard mask structure 202 is formed by a first oxide layer 201a, a second nitride layer 202b and a third oxide layer 202c which are stacked together.

The first dielectric layer 5 is formed by a fourth oxide layer.

The second dielectric layer 7 is formed by a fifth oxide layer.

The dielectric gate layer 3 is a gate oxide layer.

In this embodiment of the method, the trench-gate MOSFET is an N-type device, the first conduction type is a P type, and the second conduction type is an N type. In other embodiments of the method, the trench-gate MOSFET may be a P-type device, the first conduction type is an N type, and the second conduction type is a P type.

The invention is expounded above with reference to the specific embodiments, but these embodiments are not intended to limit the invention. Various transformations and improvements made by those skilled in this field without deviating from the principle of the invention should also fall within the protection scope of the invention.

What is claimed is:

1. A trench-gate MOSFET, wherein:
a well region of a first conduction type is formed on a surface of a semiconductor substrate in a current flow region of the trench-gate MOSFET, and a source region formed by a heavily-doped region of a second conduction type is formed on a surface of the well region;
a plurality of trenches are formed in the semiconductor substrate and penetrate through the well region in a longitudinal direction, and horizontal widths of trenches are defined by first openings formed by photo-etching a hard mask structure;
a gate dielectric layer is formed on side faces and bottom surfaces of the trenches, and the trenches are filled with polysilicon gates formed by polysilicon;
the first openings at tops of the polysilicon gates are filled with a first dielectric layer, the hard mask structure has a material different from that of the first dielectric layer, and under a self-alignment definition of the first dielectric layer, portions, between the first openings, of the hard mask structure are removed to form second openings;

first inner spacers formed by a second dielectric layer are formed through self-alignment on inner sides of the second openings, and the second openings are narrowed by the first inner spacers to form third openings; and materials, at bottoms of the third openings, of the semiconductor substrate are removed through self-alignment to allow the bottoms of the third openings to penetrate through the source region and to extend into the well region, and the third openings extending into the well region are filled with a metal layer, so that a source contact hole is formed through self-alignment at atop of the source region; a self-alignment structure of the source contact hole decreases a pitch of cell structures in a current flow region of the trench-gate MOSFET, thus, improving an integration level of the trench-gate MOSFET.

2. The trench-gate MOSFET according to claim 1, wherein a gate lead-out region is formed outside the current flow region of the trench-gate MOSFET, a trench in the gate lead-out region is communicated with the trenches in the current flow region, and the polysilicon gate in the gate lead-out region is connected with a polysilicon gates in the current flow region;

the well region extends into the gate lead-out region, and the source region is not formed on a surface of the well region in the gate lead-out region; and a first opening at a top of the polysilicon gate in the gate lead-out region is fully filled with the first dielectric layer and a fourth opening is formed in the first dielectric layer, the fourth opening is defined through photo-etching and penetrates through the first dielectric layer in the gate lead-out region, a bottom of the fourth opening extends into the corresponding polysilicon gate, and the fourth opening extending into a corresponding polysilicon gate is filled with a metal layer, so that a gate contact hole is formed.

3. The trench-gate MOSFET according to claim 2, wherein a source electrode formed by patterning a front metal layer is formed at a top of a source contact hole, and a gate electrode formed by patterning the front metal layer is formed at a top of the gate contact hole.

4. The trench-gate MOSFET according to claim 1, wherein a heavily-doped well contact region of the first conduction type is formed in the well region at a bottom of the source contact hole and makes contact with a bottom of the source contact hole.

5. The trench-gate MOSFET according to claim 1, wherein a drain region formed by a heavily-doped region of the second conduction type is formed on a back of the semiconductor substrate, and a drain electrode formed by a back metal layer is formed on a back of the drain region.

6. The trench-gate MOSFET according to claim 1, wherein the semiconductor substrate is a silicon substrate.

7. The trench-gate MOSFET according to claim 6, wherein the hard mask structure is formed by a first oxide layer, a second nitride layer and a third oxide layer which are stacked together;

the first dielectric layer is formed by a fourth oxide layer; and the second dielectric layer is formed by a fifth oxide layer.

8. The trench-gate MOSFET according to claim 6, wherein the gate dielectric layer is a gate oxide layer.

9. A method for manufacturing a trench-gate MOSFET, comprising the following steps:

Step 1, providing a semiconductor substrate, and forming a well region of a first conduction type in the semiconductor substrate;

Step 2, forming a hard mask structure on a surface of a portion, formed with the well region, of the semiconductor substrate;

Step 3, defining formation areas of trenches through photo-etching, etching the hard mask structure to form first openings, and under a definition of the first openings, etching portions, at bottoms of the first openings, of the semiconductor substrate to form trenches, wherein when a number of the trenches is more than one, and the trenches penetrate through the well region in a longitudinal direction;

Step 4, forming a gate dielectric layer on side faces and bottom surfaces of the trenches, and filling the trenches with polysilicon gates formed by polysilicon, wherein back-etched surfaces of the polysilicon gates are flush with a surface of the semiconductor substrate and completely open the first openings, wherein the surface of the semiconductor substrate is lower than a surface of the hard mask;

Step 5, filling the first openings at tops of the polysilicon gates with a first dielectric layer through deposition and back-etching, wherein the hard mask structure has a material different from that of the first dielectric layer;

Step 6, removing portions, between the first openings, of the hard mask structure under a self-alignment definition of the first dielectric layer to form second openings;

Step 7, carrying out heavily-doped ion implantation of a second conduction type to form a source region on a surface of the well region in a current flow region of the trench-gate MOSFET;

Step 8, depositing a second dielectric layer, comprehensively etching the second dielectric layer to form first inner spacers on inner sides of the second openings through self-alignment, and narrowing the second openings by the first inner spacers to form third openings, wherein the first inner spacers are formed by the second dielectric layer;

Step 9, carrying out self-alignment etching on portions, at bottoms of the third openings, of the semiconductor substrate to allow the bottoms of the third openings to penetrate through a source region and to extend into the well region; and Step 10, filling the third openings with a metal layer to form a source contact hole through self-alignment at a top of the source region, wherein a self-alignment structure of the source contact hole decreases a pitch of cell structures in the current flow region of the trench-gate MOSFET, thus, improving an integration level of the trench-gate MOSFET.

10. The method for manufacturing a trench-gate MOSFET according to claim 9, wherein a gate lead-out region is formed outside the current flow region of the trench-gate MOSFET; a trench in the gate lead-out region and the trenches in the current flow region are formed simultaneously and are communicated; a portion, in the gate lead-out region, of the gate dielectric layer and a portion, in the current flow region, of the gate dielectric layer are formed simultaneously; and a polysilicon gate in the trench in the gate lead-out region and the polysilicon gates in the trenches in the current flow region are formed simultaneously;

in Step 7, the source region is not formed on the surface of the well region in the gate lead-out region;

after the second dielectric layer is deposited in Step 8, the method further comprises the Step: carrying out photo-etching to form a fourth opening at a top of the polysilicon gate in the gate lead-out region, wherein the fourth opening penetrates through the second dielectric layer and a portion, in the corresponding first opening, of the first dielectric layer located at a bottom of the second dielectric layer;

afterwards, a portion, at a top of the first opening in the gate lead-out region, of the second dielectric layer is completely removed while the second dielectric layer is comprehensively etched to form the first inner spacers, so that the fourth opening only penetrates through the first dielectric layer;

in Step 9, self-alignment etching is carried out on the polysilicon gate at a bottom of the fourth opening while self-alignment etching is carried out on the portions, at the bottoms of the third openings, of the semiconductor substrate, so that the bottom of the fourth opening extends into the corresponding polysilicon gate; and in Step 10, the fourth opening is filled with a metal layer, so that a gate contact hole is formed.

11. The method for manufacturing the trench-gate MOSFET according to claim 10, wherein the method further comprises the following steps:

Step 11, forming a front metal layer, and patterning the front metal layer through photo-etching to form a source electrode and a gate electrode, wherein a top of a source contact hole makes contact with the source electrode, and a top of the gate contact hole makes contact with the gate electrode; and Step 12, forming a drain region formed by a heavily-doped region of the second conduction type on a back of the semiconductor substrate, forming a back metal layer on a back of the drain region, and forming a drain electrode by the back metal layer.

12. The method for manufacturing the trench-gate MOSFET according to claim 9, wherein after Step 9 is completed, the method further comprises the Step: carrying out heavily-doped implantation of the first conduction type to form a well contact region in the well region at a bottom of the source contact hole, wherein the well contact hole makes contact with the bottom of the source contact hole.

13. The method for manufacturing the trench-gate MOSFET according to claim 9, wherein the semiconductor substrate is a silicon substrate.

14. The method for manufacturing the trench-gate MOSFET according to claim 13, wherein the hard mask structure is formed by a first oxide layer, a second nitride layer and a third oxide layer which are stacked together;

the first dielectric layer is formed by a fourth oxide layer; and the second dielectric layer is formed by a fifth oxide layer.

15. The method for manufacturing the trench-gate MOSFET according to claim 13, wherein the gate dielectric layer is a gate oxide layer.

\* \* \* \* \*